US011232743B2

(12) United States Patent
Hack et al.

(10) Patent No.: US 11,232,743 B2
(45) Date of Patent: Jan. 25, 2022

(54) OLED DEVICE WITH CONTROLLABLE BRIGHTNESS

(71) Applicant: Universal Display Corporation, Ewing, NJ (US)

(72) Inventors: Michael Hack, Carmel, CA (US); Chun Lin, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 16/993,697

(22) Filed: Aug. 14, 2020

(65) Prior Publication Data

US 2020/0372856 A1 Nov. 26, 2020

Related U.S. Application Data

(63) Continuation of application No. 15/862,126, filed on Jan. 4, 2018, now Pat. No. 10,783,823.

(60) Provisional application No. 62/442,187, filed on Jan. 4, 2017.

(51) Int. Cl.

*G09G 3/3208* (2016.01)
*G09G 3/20* (2006.01)
*H01L 27/32* (2006.01)

(52) U.S. Cl.

CPC ......... *G09G 3/3208* (2013.01); *G09G 3/2003* (2013.01); *G09G 2300/0452* (2013.01); *G09G 2320/041* (2013.01); *G09G 2320/045* (2013.01); *G09G 2320/048* (2013.01); *G09G 2320/0626* (2013.01); *G09G 2380/02* (2013.01); *H01L 27/3225* (2013.01)

(58) Field of Classification Search

None

See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |

(Continued)

FOREIGN PATENT DOCUMENTS

| | | | |
|---|---|---|---|
| WO | 2008057394 | A1 | 5/2008 |
| WO | 2010011390 | A2 | 1/2010 |

OTHER PUBLICATIONS

Baldo et al.Highly efficient phosphorescent emission from organic electroluminescent devices, Nature, vol. 395, pp. 151-154, 1998.

(Continued)

*Primary Examiner* — Dorothy Harris
(74) *Attorney, Agent, or Firm* — Butzel Long

(57) ABSTRACT

Devices and techniques are provided in which an OLED panel is operated in two modes. The first mode operates in a standard way to display an image or video or otherwise illuminate sub-pixels of the panel. In the second mode, some pixels are operated at a lower brightness than in the first mode. The use of multiple modes allows for improved sub-pixel lifetime and reduced sub-pixel and image degradation.

16 Claims, 4 Drawing Sheets

(56) References Cited

U.S. PATENT DOCUMENTS

| | | | | |
|---|---|---|---|---|
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 7,279,704 | B2 | 10/2007 | Walters | |
| 7,431,968 | B1 | 10/2008 | Shtein | |
| 7,545,349 | B2 | 6/2009 | Yamada | |
| 7,968,146 | B2 | 6/2011 | Wagner | |
| 9,275,607 | B2 | 3/2016 | Albrecht | |
| 2003/0230980 | A1 | 12/2003 | Forrest | |
| 2004/0174116 | A1 | 9/2004 | Lu | |
| 2009/0135213 | A1* | 5/2009 | Tomizawa | G09G 3/2003 345/697 |
| 2010/0013867 | A1 | 1/2010 | Do-Lk | |
| 2013/0321361 | A1* | 12/2013 | Lynch | H01L 27/3225 345/204 |
| 2014/0043318 | A1* | 2/2014 | Choo | G09G 3/3225 345/214 |
| 2016/0293102 | A1* | 10/2016 | Chaji | G09G 3/3208 |
| 2017/0022963 | A1 | 1/2017 | DeBenedictis | |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

OLED DEVICE WITH CONTROLLABLE BRIGHTNESS

CROSS-REFERENCE TO RELATED APPLICATIONS

This application is a continuation of U.S. patent application Ser. No. 15/862,126, filed Jan. 4, 2018, which is a non-provisional of, and claims the priority benefit of U.S. Patent Application Ser. No. 62/442,187, filed Jan. 4, 2017, the entire contents of each of which are incorporated herein by reference.

FIELD

The present invention relates to devices including OLED components such as OLED panels in which the brightness of one or more parts of the panel can be controlled in response to environmental conditions.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, a "red" layer, material, region, sub-pixel, or device refers to one that emits light in the range of about 580-700 nm; a "green" layer, material, region, sub-pixel, or device refers to one that has an emission spectrum with a peak wavelength in the range of about 500-600 nm; a "blue" layer, material, sub-pixel, or device refers to one that has an emission spectrum with a peak wavelength in the range of about 400-500 nm; and a "yellow" layer, material, region, sub-pixel, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general there are two classes of color altering layers: color filters that modify a spectrum by removing unwanted wavelengths of light, and color changing layers that convert photons of higher energy to lower energy. Alternatively or in addition, a specific-color emissive component may be described as having a "dominant spectral distribution" of the specific color. For example, a "red sub-pixel" may emit light having a dominant spectral distribution of red light. Generally, when an emissive layer, region, sub-pixel, or other component is described herein as emitting "a color," such description refers to a single color such as red, green, light blue, deep blue, yellow, or the like, excluding white. A "white" emissive component typically is formed from multiple single-color components that are not individually addressable because the components always operate in tandem to produce white light due to the physical structure of the white device.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel According to an embodiment, a device is provided that includes an organic light emitting device (OLED) comprising a plurality of pixels, at least one pixel of the plurality of pixels comprising a first sub-pixel of a first color and a second sub-pixel of a second color; and a display controller operable to selectively operate the OLED in a first mode and a second mode. In the first mode, the display controller operates the first sub-pixel at a first brightness L1, and in the second mode, the display controller operates the first sub-pixel at a second brightness L2 that is lower than the first brightness for the same input signal. The ratio $\Delta L=L2/L1<1$ between the first brightness and the second brightness may be based upon a temperature of a portion of the device. The ratio ΔL may be a constant value, and the display controller may operate the first sub-pixel in the second mode when the portion of the device has a temperature of at least a threshold temperature T, which may be, for example, 30, 35, 40, 45, or 50 C. The ratio ΔL may be determined based on the temperature of the portion of the device and, for example, may decrease as the temperature of the device increases. Alternatively or in addition, ΔL may be selected from a plurality of values, each of which corresponds to one of a plurality of temperature ranges such as 20-30 C, 30-40 C, 40-50 C, and greater than 50 C. In some cases, at least one of the temperature ranges may correspond to a ΔL of 1. The second mode may be used with any color of sub-pixels, such as blue, deep blue, and/or light blue, and/or any type of sub-pixels, such as phosphorescent and/or fluorescent. The second mode may have a lower color temperature white point than the first mode. The device may be flexible, rollable, foldable, stretchable, curved, or any combination thereof. The device may include a rechargeable thin-film battery or similar power storage component. The device may include a wireless communication module in signal communication with the display controller, such as to receive display data for display on the device. The second mode may restrict output of the device to a subset of a display output of the device when operating in the first mode. For example, the second mode may only allow for display of text data. The device may include a wireless charging module operable to charge the device via a wireless power connection. The display controller may selectively operate the OLED in a third mode in which the first sub-pixel is operated at a third brightness that is lower than the first brightness, for the same input signal, in response to an electrical state of the device, such as being connected to a charging power source. The device may include one or more temperature sensors to determine a temperature of the device or a portion of the device. The temperature of the portion of the device may be determined based upon a state of the device, such as a charging state. The ratio ΔL may be determined based upon an expected lifetime of the first sub-pixel. The display controller may operate the OLED in the second mode when the portion of the device has a temperature of at least a threshold temperature T, which may be selected based upon an expected lifetime of the first sub-pixel. Alternatively or in addition, the display controller may operate the first sub-pixel in the second mode when the temperature of the portion of the device is at least an amount ΔT above the ambient operating temperature of the device. The temperature difference ΔT may be, for example, at least 10 C, 20 C, or 30 C, and/or it may be selected based upon an expected degradation of the first sub-pixel. In some cases, the luminance in the second mode L2 may be 0 for any temperature, i.e., some sub-pixels may be deactivated in the second mode. The device may include a rechargeable battery, external electrical charging connection, and/or a charge detection circuit capable of determining when the battery is in a charging state.

According to an embodiment, a device is provided that includes an organic light emitting device (OLED) comprising a plurality of pixels, at least one pixel of the plurality of pixels comprising a first sub-pixel of a first color and a second sub-pixel of a second color; and a display controller operable to selectively operate the OLED in a first mode and a second mode. In the first mode, the display controller may operate the first sub-pixel at a first brightness, and in the second mode, the display controller may operate the first sub-pixel at a second brightness that is lower than the first brightness, and the display controller may operate the OLED in the second mode in response to the device being placed into a charging state. Any of the features and components previously described also may be used in conjunction with this and similar embodiments.

According to an embodiment, a device is provided that includes an organic light emitting device (OLED) comprising a first plurality of sub-pixels of a first color and a second plurality of sub-pixels of a second color; and a display controller operable to selectively operate the OLED in a first mode and a second mode, based upon a temperature and/or state of the device. In the second mode, fewer sub-pixels of the first color are illuminated at a luminance greater than zero, than are illuminated in the first mode. Any of the features and components previously described also may be used in conjunction with this and similar embodiments.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
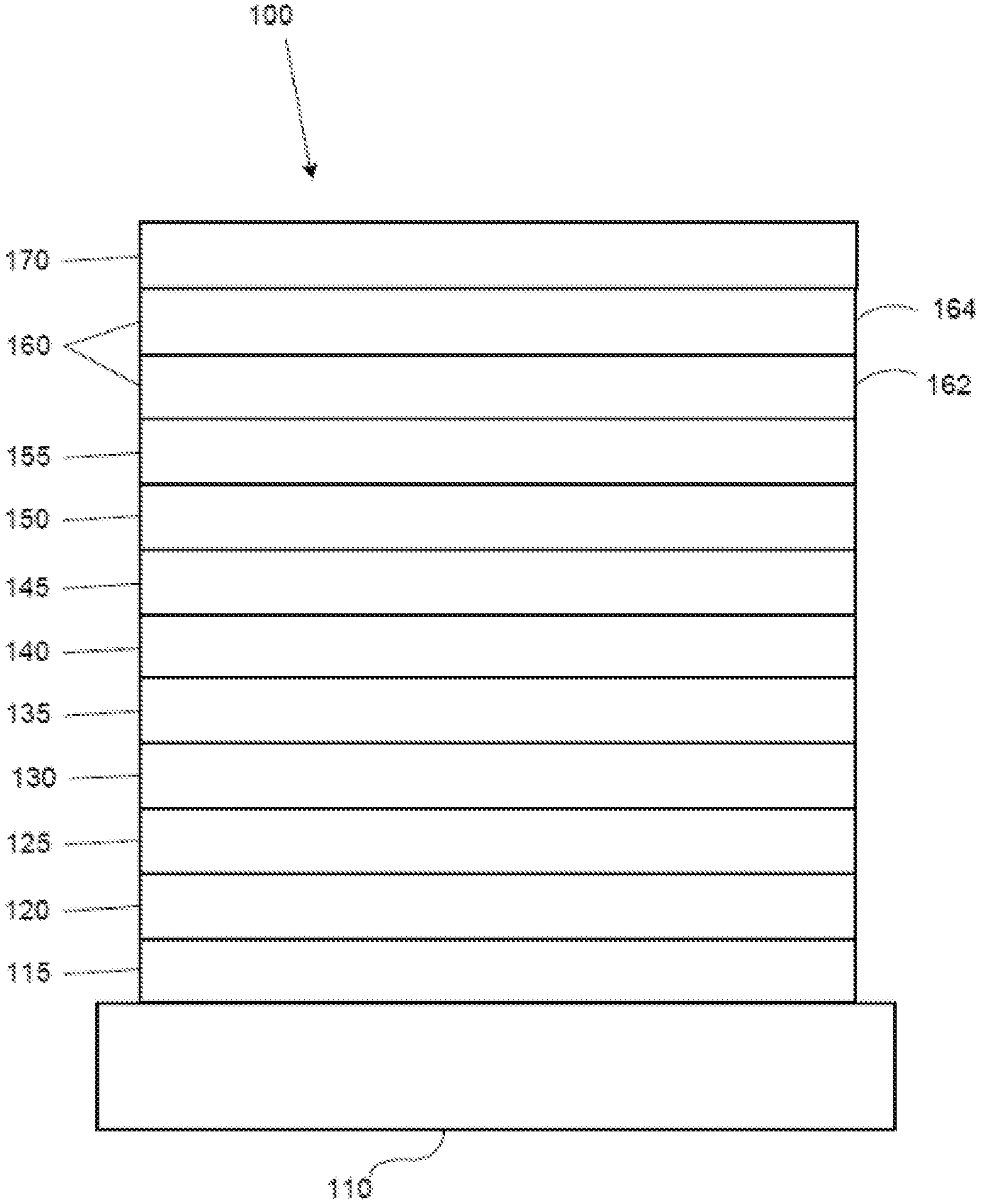
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
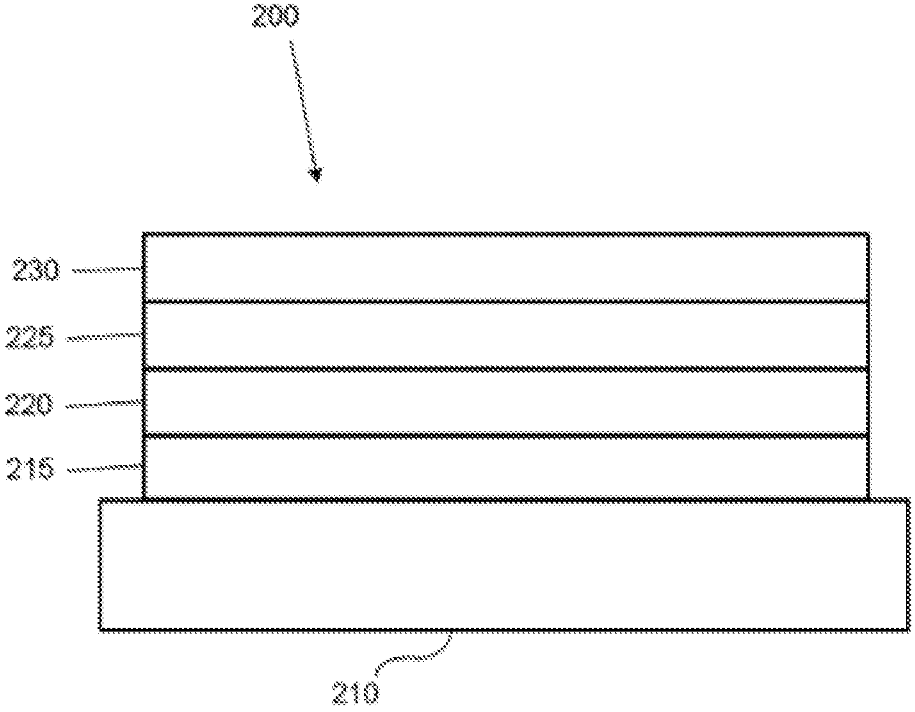
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In many OLED displays and similar devices, the amount of heat generated by the display and/or the temperature experienced by the display may be of concern. For example, some organic emissive materials such as blue and deep blue emissive materials may experience increased rates of degradation at higher temperatures. Similarly, a relatively high disparity in temperature across a display may be undesirable, since it may lead to variable degradation of emissive materials and thus uneven color as the display ages.

The presence of higher temperatures and temperature changes may be of particular concern for some OLED devices and form factors. For example, conventional OLED display modules often have one or more external connections that are used to provide power and video information to the display. However, there is increasing interest in displays and similar devices that do not need any external connections while in operation. A variety of wireless communication techniques are known for providing video information. Power can be supplied either via an electrical connector or by wireless charging. In some cases, power may be provided via an electrical connection that is only connected at various times, such as to charge an integrated battery. Local heating can be caused by large currents flowing in a conductor, and if power is charged or discharged from a device occupying a region in or near the active area of a display, local heating will arise and cause differential aging as previously described.

In some configurations, a self-contained OLED display may incorporate a flexible thin film battery to store power to operate the display. Charging and discharging the battery will generate heat, so it may be desirable to ensure that the battery has a larger surface area than the display active area, so that any heat rise on the display caused by the battery is uniform to all the active area OLED pixels.

To avoid differential aging of local regions of an OLED display close to areas of local heating, embodiments disclosed herein may use multiple modes of operation in addition to a conventional mode of operation in which all sub-pixels are driven according to the video input using conventional techniques. As described in further detail below, these additional modes of operation may reduce the brightness and/or the number of illuminated sub-pixels based on the temperature of the device or regions of the device, so as to prevent uneven aging or premature aging of some or all sub-pixels within the device. These additional modes may be used most often with blue sub-pixels, but may be used with other colors of sub-pixels or, more generally, any type of sub-pixel or other display structure for which uneven heating and aging may be of concern.

As an example, a display as disclosed herein may show images without using some or all of the blue sub-pixels in the display while the display is being charged, and/or some blue sub-pixels may be used with a lower brightness than would otherwise be the case. As blue lifetime limits display lifetime, and differential ageing effects with local heating may be more pronounced with blue sub-pixels than red, green or yellow, differential ageing effects due to local heating may be reduced or avoided by ensuring there are no operational blue sub-pixels when a portion of the display is at a higher temperature, or experiences a temperature increase, or is expected to experience a temperature increase, such as during charging of a battery in the device.

In an operating mode as disclosed herein, when a display substrate exceeds a certain temperature (e.g., a 20 C rise in temperature during operation), the display controller may reduce the luminance of the blue sub-pixels relative to the sub-pixels of other colors. Such a mode of operation may be described with reference to an all-white image rendered by the display. As the display temperature rises above a threshold temperature, the blue sub-pixels may be reduced in luminance relative to their luminance if the temperature was below the threshold, e.g. to 75% or 50% of this value, or until the temperature is once again lower than the threshold temperature. Alternatively or in addition, at very high luminances, it may be desirable to completely shut off the blue sub-pixels to reduce the display operating temperature and hence prevent accelerated degradation, i.e., to use a maximum brightness of zero when operating in this second mode. In some embodiments, a second operating mode as disclosed herein may be used when the device is subject to, or is expected to be exposed to be relatively high, such as 25 C, 30 C, 35 C, 40 C, 45 C, 50 C, or more, regardless of any temperature increase caused by operation of the device itself. For example, if an OLED display device as disclosed herein is placed within an environment that has, or is expected to have, a relatively high temperature, a second operating mode as disclosed herein may be used. The second mode may be enabled preemptively, i.e., before the relatively high temperature occurs, or it may be enabled in response to the high temperature. For example, such an embodiment may be used with a device that is placed in a location having a relatively high temperature, such as on a wall that has in-wall heating elements or hot water pipes behind it, or in an environment that is not climate controlled. As another example, such an embodiment may be used with a dashboard or other on-board display system in a car, which may be subjected to relatively high temperatures such as in the sun before air conditioning systems are active.

Alternatively or in addition, other specific events may cause localized non-uniform heating of the display for which it may be desirable to operate the display in the second mode. One example is if the display has a rechargeable battery. While this battery is being re-charged (either wirelessly or through a wired connection), it will generate heat, and it is likely that this heat will cause certain regions of the display to heat up relative to other regions. It may therefore be desirable to reduce or shut off the blue sub-pixels while the display battery is being charged, to avoid non-uniform display degradation, especially of any blue sub-pixels. Other examples of local non-uniform heat sources could be high power consuming components integrated into the overall device such as rf transmitters, or power consuming processors.

As other examples, in some embodiments the operation of a display as disclosed herein may be limited to text or graphics information only during charging, and/or the color temperature of the display white point may be reduced, for example from a conventional value of D65 (6500 K) to below 5000 K or 3000K, during charging of the device, to reduce blue luminance. As disclosed in further detail herein, these and other features and operational modes may be used to achieve improved device lifetimes and additional form factors that may be inefficient or unachievable using conventional techniques. For example, embodiments disclosed herein may enable highly flexible displays, wearable displays, displays without a separate housing (e.g., light-weight thin flexible displays with minimal bezel that could be placed in a user's hand or mounted on a wall or surface and/or which may be highly portable) and can be fully operational without any external wired connections, fully flexible OLED displays with no external interconnects, flat panel and/or flexible displays that include thin film batteries of the same size as the display, and others.

Figure 3:
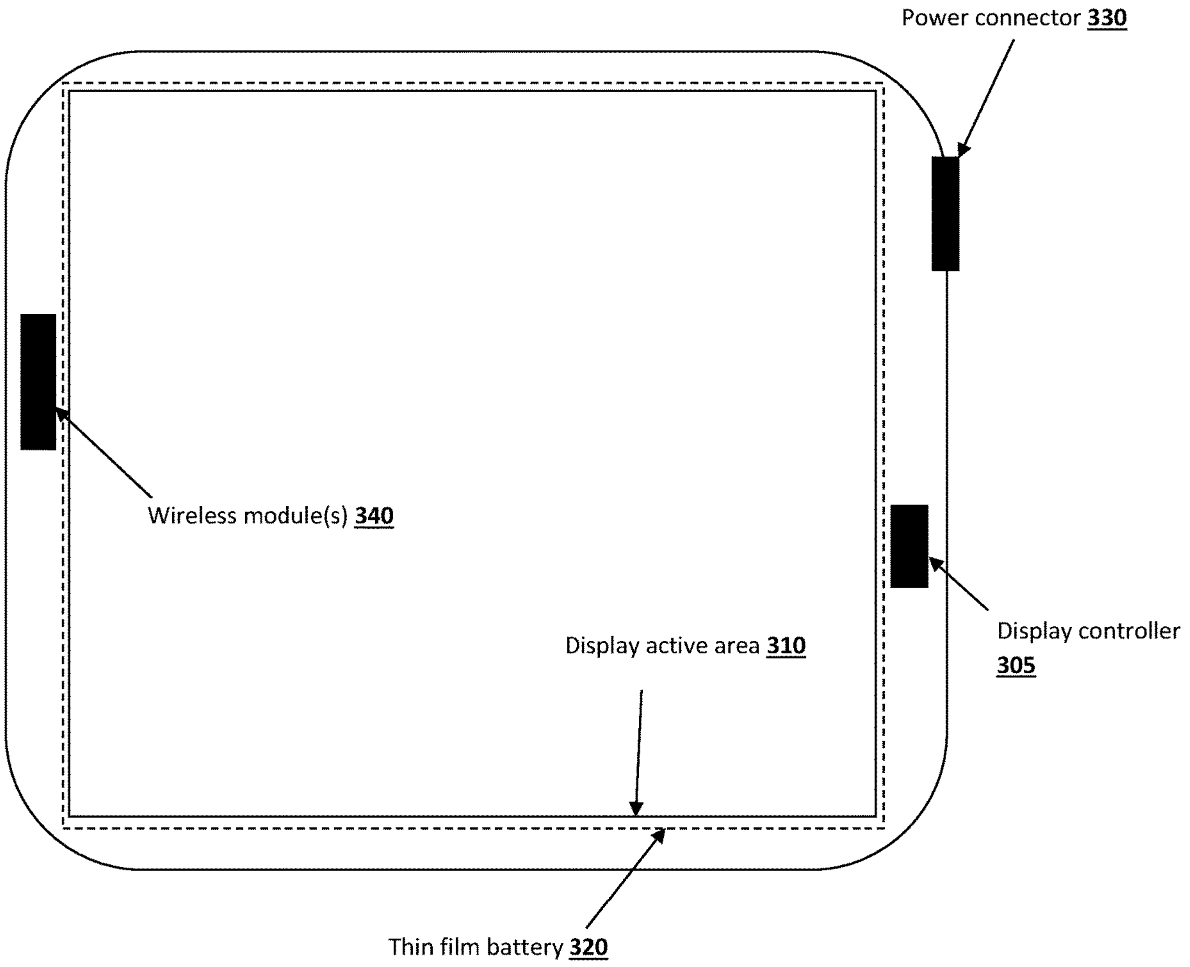
FIG. 3 shows an example of a device according to an embodiment disclosed herein.

FIG. 3 shows an example device according to embodiments disclosed herein. Such a device may include one or more OLED panels that include OLED structures previously shown and described with respect to FIGS. 1 and 2. The OLED panel may have a conventional structure of pixels and sub-pixels, i.e., multiple pixels that are individually addressable by a display controller to form a desired image on the panel. Each pixel may include one or more sub-pixels, with each sub-pixel producing one or more colors. For example, the panel may have a red-green-blue (RGB) structure, in which each pixel has red, green, and blue sub-pixels; a red-green-blue-blue (RGB1B2) structure, in which each pixel has red, green, light blue, and deep blue sub-pixels; a blue-yellow (BYYB, BYBY, etc.) structure, in which each pixel has blue and yellow emissive regions that may be controlled as RGB sub-pixels through the use of color altering layers; or any other known and/or suitable arrangement of sub-pixels. One or more types of sub-pixels may be shared among pixels, such as where one color of sub-pixel has a larger area than another, but is used by multiple pixels during operation of the device. More generally, embodiments disclosed herein do not rely on or require any particular sub-pixel arrangement or control scheme, other than as explicitly disclosed herein. Rather, it is expected that the arrangements, techniques, and benefits disclosed herein may be achieved using any arrangement of sub-pixels within an OLED display, and using any conventional drive scheme as the standard control mode as disclosed herein.

As shown in FIG. 3 and as known in the art, the OLED display device may include an active area 310 in which the controllable pixels of the display are arranged. A display controller 305 controls the pixels to provide a desired lighting arrangement, image, video display, or the like, as will be readily familiar to one of skill in the art. The display controller operates the OLED panel using any convention technique in a first, or "standard" mode. In the standard mode the display controller receives video data and converts it into luminance data that is used to provide control signals to the sub-pixels of the OLED panel. For example, for a given input, each sub-pixel may be described as being operated at a first luminancein the standard mode. Such drive techniques are known and understood in the art. In the second mode, however, the sub-pixel may be driven at a second luminance that is less than the first, for the same given input. The device may include an external power connector 330, which may be connected to an external power source continuously during operation, or only when a thin film battery 320 or other energy storage device is being charged. The device also may include one or more wireless modules 340, such as a Bluetooth, Wi-Fi, or other wireless communication module that can receive video data, control data, or any other suitable data wirelessly. A wireless power module may be used to wirelessly power the device, and/or to wirelessly charge the thin film battery 320. In some embodiments a thin film battery 320 or other power source may be arranged to overlap all, most, or a substantial portion of the display active area. Such a configuration may be preferred to "spread" the heat generated by charging the battery 320 across the active area, thereby reducing any uneven heating and resulting degradation effects that may occur when charging the battery. Devices such as shown in FIG. 3 may also include a separate device-level brightness control, which may be used by a user to change the overall brightness of the display. As used herein, relationships between the standard and second modes of operation of the display presume that no change is made to such a brightness control. That is, the second mode is described relative to the standard mode presuming a same input signal and no change to the overall device brightness by a user between the device operating in the standard first mode and the second mode.

According to embodiments disclosed herein, the display controller also may operate the OLED panel in a second mode that differs from the standard first mode of operation in that at least one sub-pixel is operated at a brightness that is lower than the brightness at which the sub-pixel is operated in the first mode. Typically a set of pixels will be operated in the second mode. For example, some or all of the sub-pixels of a particular color, and/or in a particular area of the display active area, may be operated in the second mode. Whether or not to operate any pixels in the second mode, as well as which pixels to operate in the second mode and/or the specific value for the reduced brightness to be used in the second mode, may be determined based on a temperature of the device or a portion of the device. As a specific example, if a portion of the device has, or is expected to have, an increased temperature, the most sensitive sub-pixels (typically blue sub-pixels) in that portion of the device may be operated in the second mode to reduce the relative degradation of those sub-pixels due to the increased temperature. In some cases, the sub-pixel(s) being operated in the second mode may not be illuminated at all, i.e., the reduced luminance in the second mode of operation may be zero. In this example, the second mode may effectively result in a reduced resolution of one or more colors of sub-pixels, such as where some blue sub-pixels in the display are not activated. The degree to which the brightness is reduced may be determined based upon the temperature or temperature of the portion of the device. For example, if a sub-pixel is operated at a brightness L1 in a standard mode of operation, it may be operated with a brightness of $L2<L1$ in the second mode of operation, where the ratio $\Delta L=L2/L1$ is less than 1. The particular value of L2 and/or L2/L1 may be selected based upon the temperature of the device.

The lower luminance of the second mode as discloses herein is independent of any change in luminance specified by video data processed by the display controller. In general, the video data will determine the brightness of each sub-pixel from 0% to 100% of any given brightness range, up to a maximum luminance L. In a second operating mode as disclosed herein, the brightness range will have a reduced maximum value that is less than L, but individual sub-pixels are still illuminated from 0% to 100% of this reduced value based upon the video data. If the overall display luminance is increased or decreased, for example via a separate brightness control for a device into which the display is integrated, this increase or decrease scales the luminance values for all sub-pixels but does not affect the change resulting from operation in the second operating mode as disclosed herein.

In some embodiments, a constant relative decrease in sub-pixel luminance $\Delta L$ may be used. That is, the same ratio of luminances L2/L1 may be used regardless of the absolute temperature or temperature change of the portion of the display being measured. The second mode also may be used when the device temperature in the region of the sub-pixel is at least at a threshold temperature, such as 30 C, 35 C, 40 C, 45 C, or 50 C. In this configuration, the display controller effectively operates one or more sub-pixels with one of two luminances depending upon the absolute temperature of the display. If the device has a temperature below a threshold temperature, then the standard first mode of operation is used; if the device temperature is over the threshold temperature, the second mode is used.

In some embodiments, a variable ratio $\Delta L$ may be used based upon, for example, the temperature of the device, a change of temperature of the device, a difference in temperature between different portions of the device, or the like. For example, $\Delta L$ may decrease as the temperature of the device increases. As another example, $\Delta L$ may be selected from one of several values, each of which corresponds to, and is selected for, a device temperature range. As a specific example, different $\Delta L$ values may be used for device temperatures in the following ranges: 20-30 C, 30-40 C, 40-50 C, and greater than 50 C. In general, it may be desirable for $\Delta L$ to be smaller at higher temperature ranges. As another example, $\Delta L$ may be tied more directly to the temperature of the device, such as where $\Delta L$ is defined as $1-(T-20)/50$ for a device temperature T (in Celsius), such that $20<T\leq 70$ and $\Delta L=0$ when $T>70$. The ratio $\Delta L$ also may be based upon other values or variables, such as a degradation or lifetime curve of the particular type of sub-pixel, the expected temperature due to device status (such as charging or not charging), historical conditions, or the like.

As suggested by the previous example, in some embodiments it may be desirable for the second mode of operation to include the possibility of operating one or more sub-pixels at zero luminance, i.e., not operating the sub-pixel. For example, a portion of blue sub-pixels, such as one out of every four, five, ten, or the like, across a display or a portion of a display may be reduced to a zero maximum luminance, effectively reducing the blue resolution of the display. The specific sub-pixels operated in this mode may be changed over time, so as to increase the lifetime of all blue sub-pixels in the display and reduce the effects of potentially uneven heating across the display. The portion of the display in which sub-pixels are operated in the second mode may be determined based upon the temperature of different portions of the display, as described in further detail herein. In some embodiments, a combination of zero and non-zero luminance settings may be used in a second mode. For example, some sub-pixels may be operated in the second mode with a reduced but non-zero luminance while others are operated in the second mode by turning the sub-pixels off (i.e., operating with a luminance of zero). This second mode configuration may be distinguished from a "heat shutdown" mode in which the display is completely turned off due to extreme temperatures, which may be used in conventional devices such as smart phones and tablets, because at least some sub-pixels are operated either in a first standard mode, or in a reduced but non-zero luminance mode as disclosed herein, thereby allowing the display device to continue operating even in the presence of increased temperature.

The specific sub-pixels that are operated in a second mode as disclosed herein may be selected based upon the expected lifetime of the sub-pixels, for example based upon the expected degradation due to heat of various types of sub-pixels in the display. For example, since blue sub-pixels (which may include deep blue and/or light blue) currently are expected to be most affected by higher temperatures and to have the shortest lifetimes, these sub-pixels may be operated in a second mode having a reduced luminance as disclosed herein. Sub-pixels operate in the second mode also may include fluorescent and/or phosphorescent emissive materials.

By operating some, but not all sub-pixels in a display in a second mode as disclosed herein, the color gamut, temperature, white point, etc. may be altered. For example, in some embodiments the second mode may have a lower white point color temperature than the standard mode. This may be achieved by operating blue sub-pixels in the second mode, or by operating other colors or combinations of colors of sub-pixels in the second mode.

Alternatively or in addition to the reduced luminance used in the second mode, the display panel may be operated with a reduced functionality in the second mode. For example, a display may be restricted to text output only when operated in the second mode. Such a configuration may be used, for example, for extremely high temperatures where a very restricted output is desired, when there is a sudden, unexpected, large increase in temperature, or the like.

A second mode of operation as disclosed herein may reduce the degradation experienced by sub-pixels that are operated in the second mode. For example, it has been found that the expected lifetime of an OLED generally decreases by a factor of about 1.6 for each 10 C rise in temperature, i.e., the lifetime of the OLED is generally halved for each 14 C rise in operating temperature. By reducing the brightness at which a sub-pixel is operated, the power dissipation and therefore the temperature to which the sub-pixel is subjected is reduced, thereby increasing the expected lifetime of the sub-pixel (i.e., reducing the degradation of the sub-pixel due to heat).

As previously disclosed, in some embodiments the second mode may be used when a battery in the device is being charged. Alternatively or in addition, the brightness of one or more sub-pixels may be further reduced from a set second mode level in response to an electrical state of the device, such as being connected to an electrical power source to charge a batter of the device. That is, the second mode may include an additional restriction on the brightness of the sub-pixel when the device is being charged, beyond an initial restriction imposed even when the device is not being charged.

Figure 4:
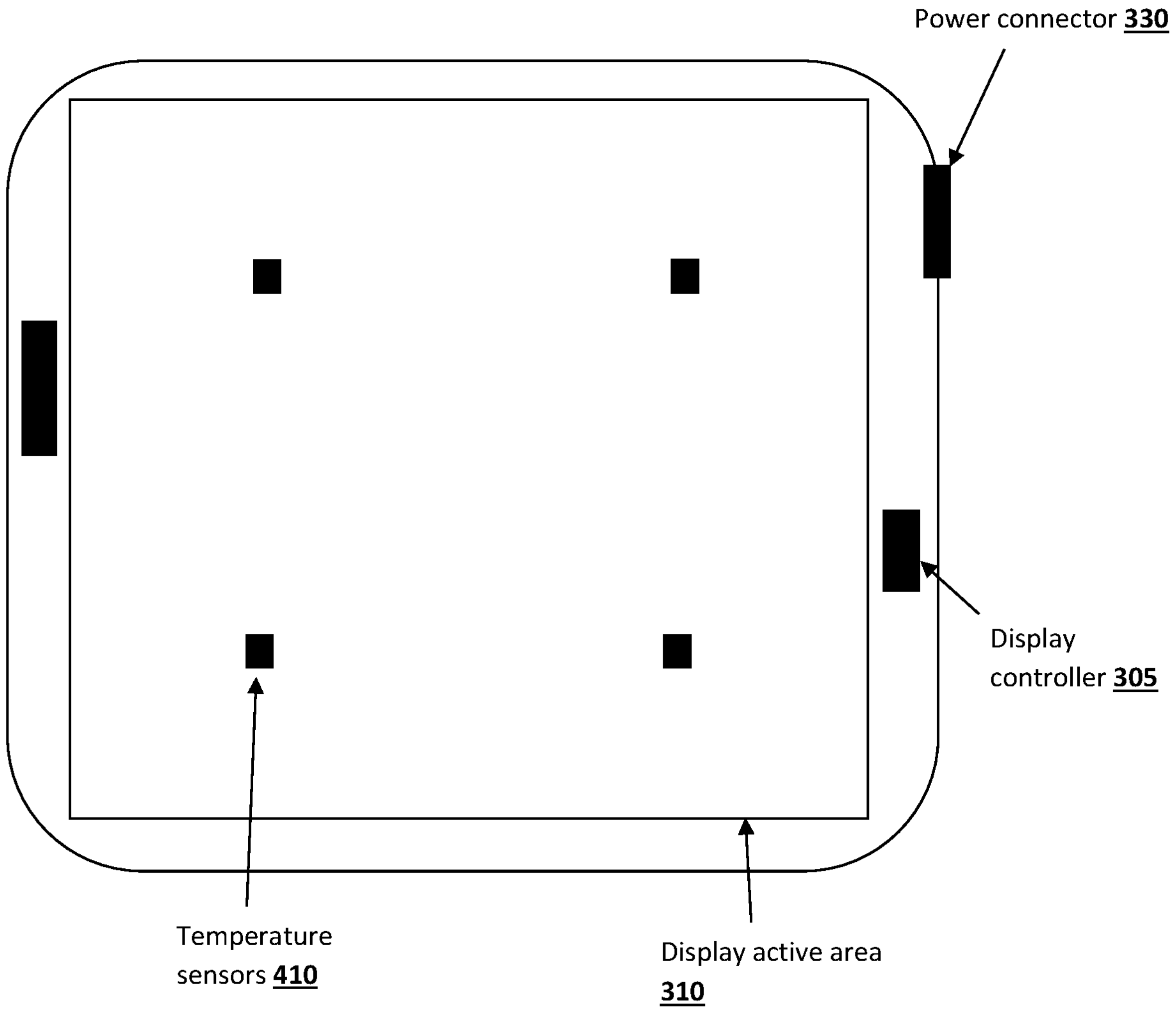
FIG. 4 shows an example of a device including multiple temperature sensors according to an embodiment disclosed herein.

In some embodiments, the device may include one or more temperature sensors to measure a temperature of a portion of the device. FIG. 4 shows an example device according to embodiments disclosed herein having four temperature sensors 410. More generally, any number of temperature sensors may be used, for example, down to a resolution of about 1 $cm^2$, i.e., one sensor disposed within, and configured to measure the temperature of about 1 $cm^2$ area of the device, for example measured across a substrate of the display panel. Each temperature sensor may measure a temperature of the portion of the device in which the sensor is placed. In embodiments in which multiple temperature sensors are used, each sub-pixel may be considered to be "in the region" of the temperature sensor to which it is closest, measured across a substrate of the OLED display panel. Each temperature sensor may be used to determine a temperature of a corresponding portion of the device, and sub-pixels may be selectively operated in a second mode as disclosed herein based upon the temperature measured in the region of the sub-pixel. For example, referring to FIG. 4, if the upper-left temperature sensor measures a temperature that indicates sub-pixels should be operated in the second mode, some or all sub-pixels in the upper left of the display may be operated in the second mode, using any of the selection techniques previously disclosed (e.g., each sub-pixel of a selected color; a portion of sub-pixels of one or more colors, etc.). Alternatively, data from one or more sensors may be used to determine a temperature for the entire active area or for a portion of the active area. For example, an average of temperature data from all available sensors, or a maximum value obtained from any of the sensors, may be used as the temperature of the panel. As another example, an average or maximum value of a subset of the sensors, such as all sensors in the top half of the panel, may be used as the temperature of that portion of the panel.

In some embodiments, the temperature of the panel or a portion of the panel may be presumed based upon a state of the device. For example, the heat dissipation rate of a battery in the device during charging may be sufficiently well known that a temperature of the device during charging and operation of the device may be predictable with a relatively high level of accuracy. Thus, the display controller may operate as if the calculated temperature is the actual temperature of the panel, and operate one or more pixels in the second mode accordingly. Other states and state changes may be used to predict a device temperature.

Similarly, in some embodiments, the relative luminance in the second mode compared to the standard mode may be determined or selected based upon physical characteristics and calculated properties of the device. For example, an expected lifetime of one or more sub-pixels that are operable in the second mode may be used to select ΔL. As a specific example, a luminance-lifetime curve for a particular type of sub-pixel, such as a blue sub-pixel, may be known based on testing or computer modeling. Such a curve may be used to select one or more ΔL values for the second mode, using any of the operating parameters for the second mode as previously disclosed herein. In some embodiments that use a threshold temperature as previously disclosed, the threshold temperature similarly may be selected based upon lifetime information of one or more sub-pixels in the display panel.

In some embodiments, the second mode may be used when a portion of the device experiences an increase of temperature over the ambient operating temperature of the device. The increase may be a threshold amount, such that increases in temperature of less than the threshold amount do not cause the display controller to operate in the second mode. For example, in some embodiments the second mode may be used when the device, or a portion of the device, experiences a temperature increase of at least 10 C, at least 15 C, or at least 20 C above an average operating temperature of the device. The average operating temperature may be pre-defined, or it may be determined based upon temperature measurements taken during operation of the device or measurements of the ambient environment in which the device is operating. The change in temperature above which the second mode is used may be selected or determined based upon an expected degradation of sub-pixels that are operated in the second mode, much in the same way as the relative luminance ΔL may be selected, as previously disclosed.

In some embodiments, a second mode of operation as previously disclosed may be used whenever the device is in a particular state, regardless of the absolute temperature or relative temperature change of the device. For example, in many cases it may be expected that a device as disclosed herein will experience an increase in temperature when connected to an external power supply, whether for routine operation or when the device is in a charging state in which a rechargeable battery is drawing power from an external source. In such an embodiment, the device may be operated in a second mode as disclosed herein regardless of any actual, measured, or expected temperature or temperature change of the device. The second mode may be selected and operate in any of the ways previously disclosed. In some arrangements, a charge detection circuit or comparable arrangement integrated with the device may be used to determine automatically when the device has been connected to a wired or wireless power source. The display adapter may operate the OLED in the second mode in response to such a determination. Such embodiments may omit temperature sensors from the device, which may simplify device fabrication and operation.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:

an organic light emitting diode (OLED) device comprising a plurality of pixels, at least one pixel of the plurality of pixels comprising a first sub-pixel of a first color and a second sub-pixel of a second color different than the first color; and a display controller operable to selectively operate the OLED device in a first mode and a second mode;

wherein, in the first mode, for a given display image, the display controller operates the first sub-pixel at a first brightness L1, and the display controller operates the second sub-pixel at a second brightness M1, and in the second mode, for the given display image, the display controller operates the first sub-pixel at a third brightness L2 that is lower than the first brightness L1 and the display controller operates the second sub-pixel at a fourth brightness M2 that is lower than the first brightness M1 wherein the ratio ΔL=L2/L1 is less than the ratio M2/M1 and is based upon an overall brightness of the device.

2. The device of claim 1, wherein the first color is deep blue or light blue.

3. The device of claim 1, wherein the display operates at a lower white point color temperature in the second mode than in the first mode.

4. The device of claim 1, wherein, in the second mode, the display controller operates the second sub-pixel at a brightness that is lower than a brightness at which the display controller operates the second sub-pixel in the first mode.

5. The device of claim 1, wherein L2 is zero.

6. The device of claim 1, wherein ΔL is selected from a plurality of values, each of which corresponds to one of a plurality of operating brightness values.

7. The device of claim 1, wherein the device is flexible, rollable, foldable, stretchable, curved, or a combination thereof.

8. The device of claim 1, further comprising a rechargeable thin-film battery.

9. The device of claim 1, further comprising a wireless communication module in signal communication with the display controller and operable to receive display data for display on the device.

10. The device of claim 1, further comprising a wireless charging module operable to charge the device via a wireless power connection.

11. The device of claim 1, wherein ΔL is selected based upon an expected lifetime of the first sub-pixel.

12. An electronic device comprising the device of claim 1.

13. The electronic device of claim 12, wherein the electronic device comprises a type selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a micro-display less than 2 inches diagonal, a 3-D display, a virtual reality or augmented reality display, a vehicle, a video wall comprising multiple displays tiled together, a theater or stadium screen, and a sign.

14. The device of claim 1, wherein the display controller operates the OLED in the second mode in response to the device being placed into a charging state.

15. The device of claim 14, further comprising:

a rechargeable battery; and an electrical connection to provide a charging current to the rechargeable battery.

16. The device of claim 14, further comprising a charge detection circuit operable to provide a signal to the display controller indicating that the device is connected to an external power source.

* * * * *